United States Patent [19]

Akiyama

[11] Patent Number: 5,671,395
[45] Date of Patent: Sep. 23, 1997

[54] METHOD AND SYSTEM FOR DIVIDING ANALYZING REGION IN DEVICE SIMULATOR

[75] Inventor: Yutaka Akiyama, Tokyo, Japan

[73] Assignee: NEC Corporation, Tokyo, Japan

[21] Appl. No.: 306,970

[22] Filed: Sep. 16, 1994

[30] Foreign Application Priority Data

Sep. 17, 1993 [JP] Japan ................................ 5-230627

[51] Int. Cl.$^6$ .............................. G06K 9/46; G06T 17/20
[52] U.S. Cl. ........................ 395/500; 395/119; 364/491; 364/578; 364/468.04; 382/154
[58] Field of Search .................................. 395/500, 141, 395/119, 123, 124, 921; 364/491, 488, 578, 468.04; 382/154, 241

[56] References Cited

U.S. PATENT DOCUMENTS

| | | | |
|---|---|---|---|
| 4,912,664 | 3/1990 | Weiss et al. ............................ | 364/577 |
| 5,125,038 | 6/1992 | Meshkat et al. ....................... | 364/578 |
| 5,214,752 | 5/1993 | Meshkat et al. ....................... | 395/123 |
| 5,428,726 | 6/1995 | Piegl et al. ............................. | 395/141 |

OTHER PUBLICATIONS

Kanaganathan et al., "Comparison of Four–point Adding Algorithms for Delaunay–type Three dimensional Mesh Generators", IEEE May 1991, pp. 3444–3451.

Lu et al., "A Numerical Stable Algorithm for Constructivity Constrained Delaunay Triangulation and Application to Multichip Module Layout", IEEE Jun. 1991, pp. 644–647.

Yuan et al., "A Mesh Generator for Tetrahedral Elements Using Delaunay Triangulation", IEEE Mar. 1993, pp. 1906–1909.

M.S. Mock, "Tetrahedral Elements and the Scharfetter--Gummel Method", Proceeding of the NASECODE, IV, (1985), pp. 36–47. (month is not available).

Primary Examiner—Kevin J. Teska
Assistant Examiner—Tan Q. Nguyen
Attorney, Agent, or Firm—Foley & Lardner

[57] ABSTRACT

A region of a semiconductor device to be analyzed is initially divided a plurality of fractional elements of predetermined configuration. With respect to each fractional element, adjacent element information is provided. Then, a new nodal point is added. Then, one fractional element having a circumscribed circle enclosing the new nodal point is retrieved. Another fractional elements adjacent the retrieved fractional element and having the circumscribed circle enclosing the new nodal point are retrieved for establishing a fractional element group of the fractional elements having the circumscribed circles enclosing the new nodal point. The fractional elements are established on the basis of the boundary of the fractional element group and the new nodal point. The adjacent element information is then added for respective of the newly established fractional elements.

10 Claims, 9 Drawing Sheets

METHOD AND SYSTEM FOR DIVIDING ANALYZING REGION IN DEVICE SIMULATOR

BACKGROUND OF THE INVENTION

1. Field of the Invention

The present invention relates generally to a method and a system for dividing a region to be analyzed (analyzing region) of a semiconductor device in a device simulation technology. More specifically, the invention relates to a method and a system for dividing an analyzing region into triangular or tetrahedral fractional regions.

2. Description of a the Related Art

In fabrication of semiconductor device, simulation has been performed employing a device simulator which calculates a physical amount in the semiconductor device using a computer and deriving electric characteristics, such as terminal current, threshold voltage and so forth of a transistor. Upon performing optimization of the transistor for attaining optimal electric characteristics of the semiconductor device, it can significantly save expense and time by employing the device simulator in comparison with experimentally fabricating an actual LSI. Also, since the physical amount in the semiconductor device is calculated in the device simulator it is possible to check behavior of electrons and holes within the semiconductor. Therefore, it becomes possible to use it for clearing up the cause of impact ionizing phenomenon which causes problems in a fine MOSFET.

In the device simulator, in order to obtain the physical amount within the semiconductor transistor, separative variation within the semiconductor is analyzed by solving a partial differential equation, such as Poisson equation expressing a relationship between a potential and a carrier concentration and current continuity equation and so forth expressing a relationship between a potential and a carrier concentration. A method for solving such a partial differential equation is the method disclosed in Dan, "Process Device Simulation Technology" (edited: SanGyo Tosho), pp 113 to 122. In the above-identified literature, there is disclosed a method, in which the semiconductor device is divided into small fractional regions for calculating the partial differential equation in a discrete manner.

As a unit for division of the semiconductor device, quadrangular-shape configuration in the case of three-dimensional division and rectangular parallelpiped configuration in the case of two-dimensional division are typically employed for simplification. However, when the semiconductor device is divided into quadrangular or rectangular parallelpiped fractional regions and if the semiconductor device has an oblique configuration, such oblique configuration has to be approximated in a stepwise manner which makes it impossible to exactly express the configuration. Therefore, there is a proposal for dividing the semiconductor device into triangular fractional regions (triangular elements) in the case of two-dimensional division and into tetrahedral factional regions (tetrahedral elements) in the case of three-dimensional division.

In the latter case, the division of the semiconductor device should be a Delaunay division not to containing any peak of another triangular element or tetrahedral element within a circumscribed circle of the divided triangular element or circumscribed sphere of the divided tetrahedral element. A method for realizing Delaunay division has been disclosed in M. S. Mock, "Tetrahedral Elements and the Scharfetter-Gummel Method" (Proceeding of the NASECODE, IV, PP 36 to 47, 1985). In this literature, a discussion for the method is given by taking the case of a two-dimensional division as an example, that boundary points of the material or points necessary for improving accuracy of calculation in the triangular element group already divided by Delaunay division are taken as new nodal points to add in one-by-one basis to further division into smaller fractional regions. In this method, when one nodal point is added for a Delaunay divided triangular element, triangular elements having circumscribed circles containing the new nodal point therewithin are extracted from all triangular element groups and new triangular elements are established by taking a predetermined edge of the existing triangular element as a base and the new nodal point as a peak.

Also, by extending this method to the three-dimensional division, Delaunay division employing the tetrahedral element can be performed.

However, in the conventional method set forth above, it becomes necessary to make a judgement whether the circumscribed circle or circumscribed sphere includes the new nodal point with respect to all triangular or tetrahedral elements which are already divided by Delaunay division whenever a new nodal point is added for the triangular element group or the tetrahedral element group. Accordingly, according to an increase in the number of the triangular elements or the tetrahedral elements, the calculation period is extended in a ratio of the square of the number of the triangular elements or the tetrahedral elements.

SUMMARY OF THE INVENTION

It the first object of the present invention is to provide a method for retrieving triangular elements and tetrahedral elements with a reducing number of existing triangular elements and tetrahedral elements to make the judgement whether a new nodal point is included within a circumscribed circle or a circumscribed sphere thereof.

Another object of the invention is to provide a dividing system for an analyzing region realizing the retrieving method.

According to one aspect of the invention, a method for dividing a region to be analyzed comprises the steps of:

performing initial division with respect to the region to be analyzed in a semiconductor device for initially dividing the region to be analyzed into a plurality of fractional elements of predetermined configuration;

generating adjacent element information for fractional elements established by initial division;

adding a new nodal point;

retrieving one fractional element having a circumscribed region enclosing the new nodal point as a specific fractional element;

retrieving other fractional elements adjacent the specific fractional element and having the circumscribed region enclosing the new nodal point for establishing a fractional element group of the retrieved fractional elements;

re-establishing the fractional elements in the region defined by a boundary of the fractional element group on the basis of the boundary of the fractional element group and the new nodal point as peak of respective fractional elements; and adding adjacent element information for respective of the newly established fractional elements.

The step of retrieving other fractional elements may be progressed outwardly in one by one basis with respect to the specific fraction elements. In such case, the step of retrieving other fractional elements is terminated when no further additional fraction element having circumscribed region enclosing the new nodal point.

The fractional element may be of triangular configuration and the circumscribed region is defined by a circumscribed circle of the triangular fractional element. In the alternative, the fractional element may be of a tetrahedral configuration and the circumscribed region is defined by a circumscribed sphere of the tetrahedral fractional element.

In the former case, it is preferred that the step of retrieving other fractional elements comprises the steps of:

registering the one triangular element as a parent triangular element;

making judgement whether a child triangular element having the circumscribed circle enclosing the new nodal point is present among child triangular elements adjacent the parent triangular element;

storing the parent triangular element as an objective triangular element for retrieval and setting the child triangular element having the circumscribed circle enclosing the new nodal point as new parent triangular element when the child triangular element having the circumscribed circle enclosing the new nodal point is present; and making judgement whether the process is performed with respect to all of the triangular elements having circumscribed circles enclosing the new nodal point and repeating the process until the process is completed for all of the triangular elements having circumscribed circles enclosing the new nodal point.

In the latter case, it is preferred that the step of retrieving other fractional elements comprises the steps of:

registering the one tetrahedral element as a parent tetrahedral element;

making judgement whether a child tetrahedral element having the circumscribed sphere enclosing the new nodal point is present among child tetrahedral elements adjacent the parent tetrahedral element;

storing the parent tetrahedral element as an objective tetrahedral element for retrieval and setting the child tetrahedral element having the circumscribed sphere enclosing the new nodal point as new parent tetrahedral element when the child tetrahedral element having the circumscribed sphere enclosing the new nodal point is present; and making judgement whether the process is performed with respect to all of the tetrahedral elements having circumscribed spheres enclosing the new nodal point and repeating the process until the process is completed for all of the tetrahedral elements having circumscribed spheres enclosing the new nodal point.

According to another aspect of the invention, a system for dividing a region to be analyzed comprises the steps of:

means for performing initial division with respect to the region to be analyzed in a semiconductor device for initially dividing the region to be analyzed into a plurality of fractional elements of predetermined configuration;

means for generating adjacent element information for fractional elements established by initial division;

means for adding a new nodal point;

means for retrieving one fractional element having a circumscribed region enclosing the new nodal point as a specific fractional element;

means for retrieving other fractional elements adjacent the specific fractional element and having the circumscribed region enclosing the new nodal point for establishing a fractional element group of the retrieved fractional elements;

means for re-establishing the fractional elements in the region defined by a boundary of the fractional element group on the basis of the boundary of the fractional element group and the new nodal point as peak of respective fractional elements; and means for adding adjacent element information for respective of the newly established fractional elements.

Further objects, features and advantages of the present invention will become clear from the detailed description given herebelow.

BRIEF DESCRIPTION OF THE DRAWING

The present invention will be understood more fully from the detailed description given herebelow and from the accompanying drawings of the preferred embodiment of the present invention, which, however, should not be taken to be limitative of the invention, but are for explanation and understanding only.

In the drawings.

DESCRIPTION OF THE PREFERRED EMBODIMENT

The present invention will be discussed in detail in terms of the preferred embodiments with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscuring the present invention.

Figure 1:
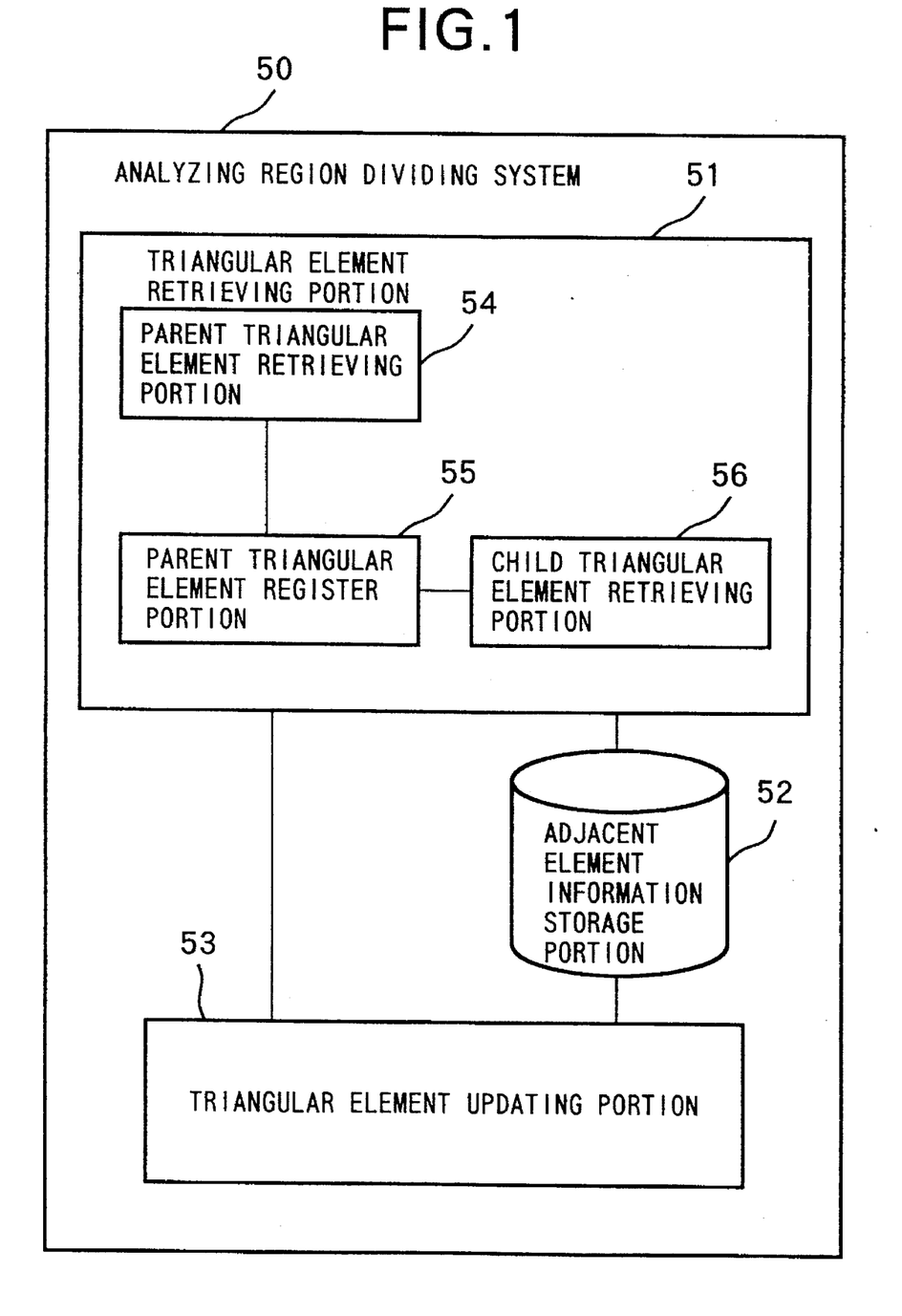
FIG. 1 is a block diagram showing a construction of the first embodiment of an analyzing region dividing system according to the present invention.

FIG. 1 is a block diagram showing the construction of the first embodiment of an analyzing region dividing system 50 according to the present invention.

As shown, the first embodiment of analyzing region dividing system 50 includes a triangular element retrieving portion 51 for retrieving predetermined triangular elements within an existing triangular element group as fractional regions dividing a semiconductor device, an adjacent element information storage portion for storing adjacent element information between triangular elements, and a triangular element updating portion 53 for further dividing the triangular element group by way of Delaunay division with reference to the result of retrieval by the triangular element retrieving portion 51.

The triangular element retrieving portion 51 has a parent triangular element retrieving portion 54 for retrieving a parent triangular element to be a reference for Delaunay division, a parent triangular element registering portion 55 for registering the. retrieved triangular element, and a child triangular element retrieving portion 56 for retrieving a child triangular element adjacent the parent triangular element. The functions and operations of respective portions will be discussed later.

The adjacent element information storage portion 52 stores information associating adjacent triangular elements with respect to the triangular elements established by initial Delaunay division and newly established triangular elements established by the triangular element updating portion 53.

The triangular element updating portion 53 makes reference to the result of retrieval of the triangular element retrieving portion and updates the triangular element group into a further divided new triangular element group. Also, the triangular element updating portion stores the adjacent element information of mutually adjacent triangular elements in the newly established triangular element group in the adjacent element information storage portion 52.

Figure 2:
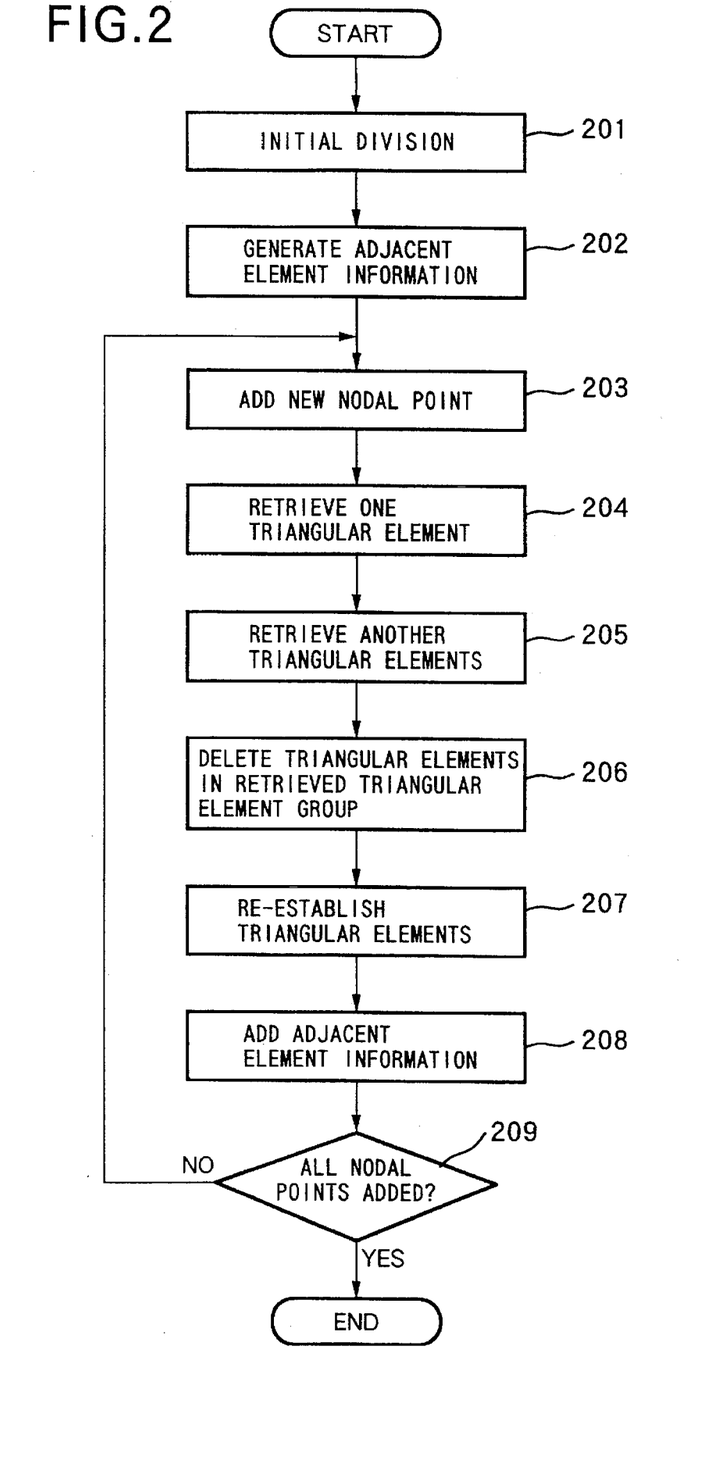
FIG. 2 is a flowchart showing operation of the first embodiment of an analyzing region dividing system.

Next, the operation of the shown embodiment will be discussed with reference to the flowchart of FIG. 2.

For dividing the semiconductor device as an object for analysis into small fractional regions, an initial Delaunay division is formed by way of an external command input or so forth (step 201). For instance, assuming that an analyzing region has a rectangular configuration, an initial Delaunay division can be performed by providing a diagonal line to establish two right angled triangles. Then, for the triangular element established by the initial Delaunay division, adjacent element information is provided (step 202). The adjacent element information is stored in the adjacent element information storage portion 52.

Next, a necessary new nodal point is added to a predetermined position within the analyzing region (step 203). Necessity of addition of the new nodal point is primarily caused:

(1) when nodal points are added for clearly defining the boundary of the material;

(2) when the nodal point is added for solving crossing between the triangle and the boundary of material included in the analyzing region for the purpose of improvement of precision of analysis;

(3) when the nodal point is added for deleting a triangle having a circumcenter located out of the boundary of the material for the purpose of improvement of precision of analysis; and (4) when the circumcenter of the triangle is set as a new nodal point for further dividing a triangle having a large circumscribed circle into triangles having smaller circumscribed circles for the purpose of improvement of precision of analysis.

The position to add the nodal point is preliminarily fixed depending upon the physical structure of the semiconductor device in the case of (1). In the case of (2) and (3), the position of the nodal point is appropriately determined depending upon the physical boundary point and the current dividing condition. In the case of (4), the position of the nodal point is determined in a straightforward manner at the position of the circumcenter of the triangular element to be divided. It should be noted that the addition of the new nodal point may be performed by an external command input by an operation or so forth.

Next, by the triangular element retrieving portion 51, only one triangular element having the circumscribed circle enclosing the newly added nodal point is retrieved (step 204). As one example of high speed retrieval, the whole analyzing region is divided into appropriately sized rectangular regions. Then, retrieval is initially performed to find the rectangular region, in which the new nodal point is located. Subsequently, with respect to the triangular elements within the rectangular region containing the new nodal point, retrieval is performed for retrieving the triangular elements having the circumscribed circle enclosing the new nodal point. It should be appreciated that, in the case of (4), since the new nodal point is set at the circumcenter of the triangular element, it is obvious that the new nodal center is enclosed in the circumscribed circle of the objective triangular element. Therefore, it is unnecessary to perform retrieval for the triangular element having the circumscribed circle enclosing the new nodal center.

Next, the triangular element retrieving portion 51 performs retrieval for retrieving triangular elements adjacent to the retrieved triangular element and having the circumscribed circle including a new tangent point on the basis of the adjacent element information stored in the adjacent element storage portion 52 ( step 205).

Next, by the triangular element updating portion 53, all triangular elements retrieved up to the step 205 are deleted (step 206). Then, by taking outermost edges of respective triangular elements in the deleted triangular element group as base and the new nodal point as a peak, new triangular elements are established (step 207). Thereafter, the triangular element updating portion 53 adds the adjacent element information for the newly established triangular elements and stores this information in the adjacent element information storage portion 52 (step 208).

The operator makes the judgement whether all of the necessary nodal points are added with reference to the configuration and physical structure of the semiconductor device and the current dividing condition by the analyzing region dividing system. If necessary, the foregoing operation is repeated by adding a new nodal point (step 209).

Figure 3:
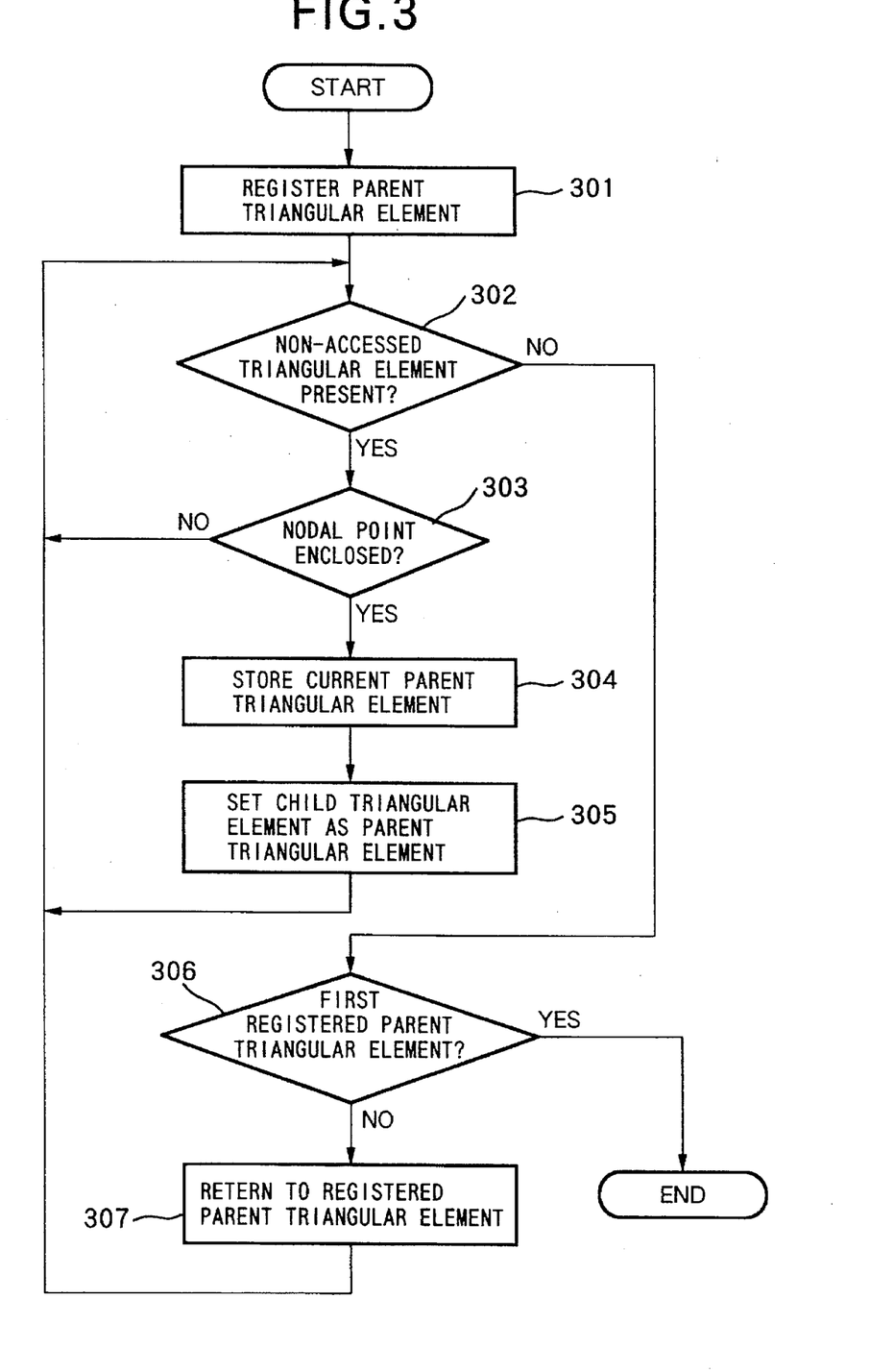
FIG. 3 is a flowchart showing a triangular element retrieving method employed in the shown embodiment.

Next, discussion will be given for the retrieval operation for the triangular element by the triangular element retrieving portion 51 at the steps 204 and 205, with reference to the flowchart of FIG. 3.

At first, when the new nodal point is set for further dividing the semiconductor device into smaller fractional regions, one of the triangular elements is registered having the circumscribed circle enclosing the new nodal point as the parent triangular element by the parent triangular element retrieving portion 54 and the parent triangular element registering portion 55 (step 301). The triangular element to be the parent triangular element is selected arbitrarily among the triangular elements having the circumscribed circles enclosing the new nodal point. Then, judgement is made whether the child triangular element retrieving portion 56 accesses all of the triangular elements (child triangular element) adjacent the registered triangular element (parent triangular element) (step 302).

When there is a child triangular element which has not been accessed, the child triangular element retrieving portion 56 makes judgement whether the circumscribed circle of the triangular element in question encloses the nodal point, sequentially on a one-by one basis (step 303). Here, when the distance between the circumcenter of the triangular element and the new nodal point is greater than the radius of the circumscribed circle, judgement is made that the new nodal point is not enclosed in the circumscribed circle of the triangular element in question. In contrast, when the distance between the circumcenter of the triangular element and the new nodal point is smaller than or equal to the radius of the circumscribed circle, judgement is made that the new nodal point is enclosed in the circumscribed circle of the triangular element in question.

When judgement is made by the child triangular element retrieving portion 56 that the child triangular element in question encloses the new nodal point, the information of the parent triangular element is stored (step 304). Then, by taking the child triangular element processed as set forth above as the parent triangular element, the foregoing process is repeated (step 305). On the other hand, when the child triangular element retrieving portion 56 makes judgement that the circumscribed circle of the child triangular element in question does not enclose the new nodal point, the foregoing process is performed with respect to the next child triangular element (step 303).

After accessing all of the child triangular elements adjacent the parent triangular element registered in the parent triangular element register portion 54, the parent triangular element register portion 55 checks whether the current parent triangular element is the first parent triangular element registered (step 306). Then, if judgement is made that the parent triangular element in question is not the first registered one, the process is repeated by returning to the registered parent triangular element (step 307). On the other hand, when the judgement that the parent triangular element in question is the one registered, it means that all of the triangular elements having a circumscribed circle enclosing the new nodal point are retrieved around the first registered triangular element as the parent triangular element. Therefore, the process is terminated (step 306). Here, the triangular elements registered as the parent triangular elements are all triangular elements having the circumscribed circles enclosing the new nodal point.

Figure 7:
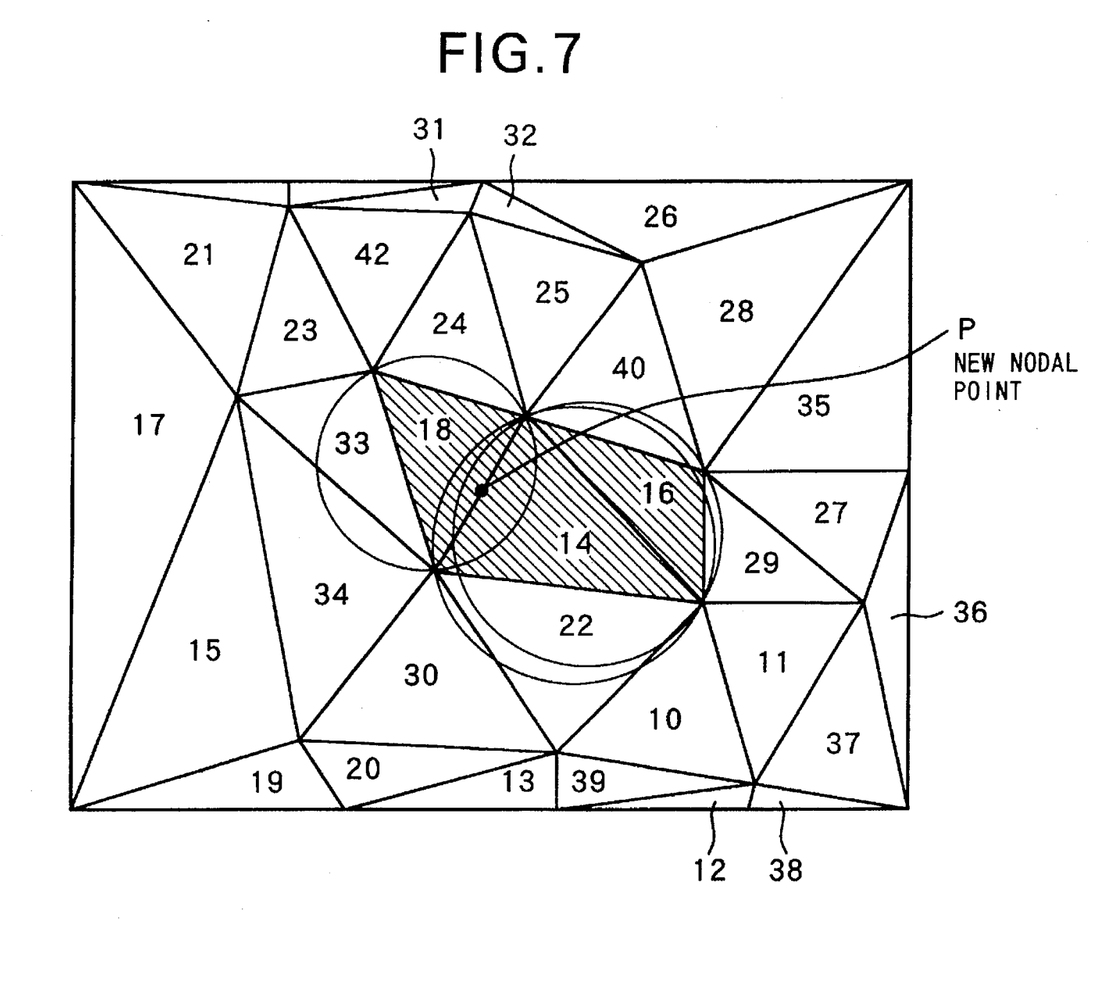
FIG. 7 is an illustration showing a condition where a new nodal point is added for a semiconductor device which is divided by way of Delaunay division.

FIG. 7 shows an example, in which a rectangular semiconductor device is divided. In FIG. 7, it is assumed that the triangular element 14 enclosing the new nodal point P within its circumscribed circle is the first registered parent triangular element. Then, the triangular elements 22, 18, 16 respectively adjacent the triangular element 14 become child triangular elements. Among these, the triangular elements 18 and 16 have circumscribed circles enclosing the new nodal point P. Therefore, they become parent triangular elements in order. Then, with respect to the child triangular elements of these triangular elements 18 and 16, a check is performed whether the circumscribed circles thereof enclose the new nodal point P. On the other hand, the child triangular element 22 does not enclose the new nodal point P within the circumscribed circle thereof. Therefore, this triangular element 22 will not become the parent triangular element. The triangular element group consisting of the triangular elements 14, 18 and 16 defines the region to be further divided on the basis of the new nodal point. Then, the boundaries between the triangular elements 14 and 22, between triangular elements 18 and 33, between the triangular elements 18 and 24, between triangular elements 16 and 40 and between triangular elements 16 and 29 become outermost edges. Then, by taking respective outermost edges as a base, and the new nodal point P as the peak, new triangular elements are established.

Figure 8:
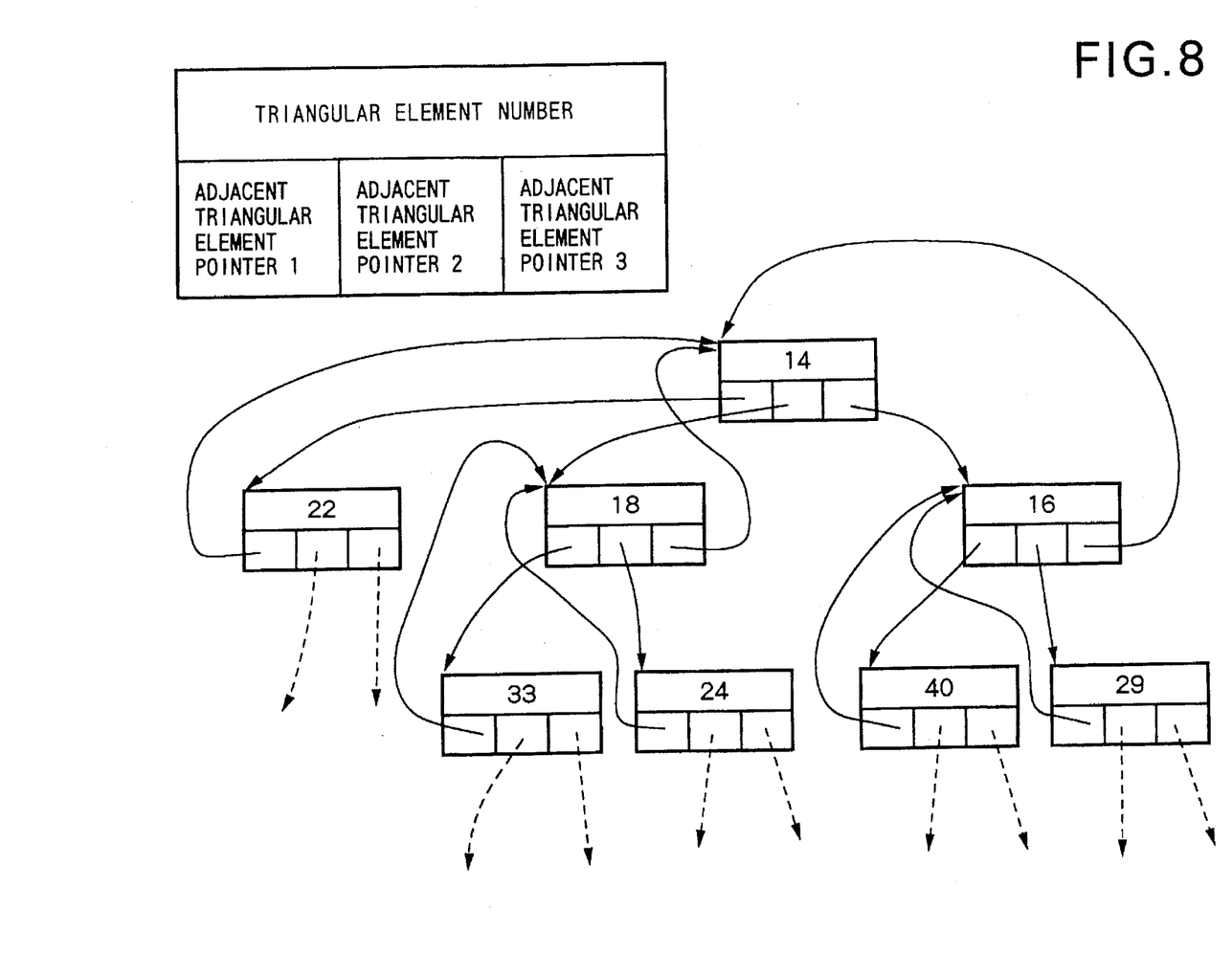
FIG. 8 is an illustration showing a data structure to be employed in the present invention.

FIG. 8 shows a data structure for realizing the present invention. For each triangular element, there are three triangular elements adjacent thereto. Therefore, pointers indicative of adjacent triangular elements of the triangular element in question are stored. The pointers thus stored serve as the adjacent element information.

Figure 9:
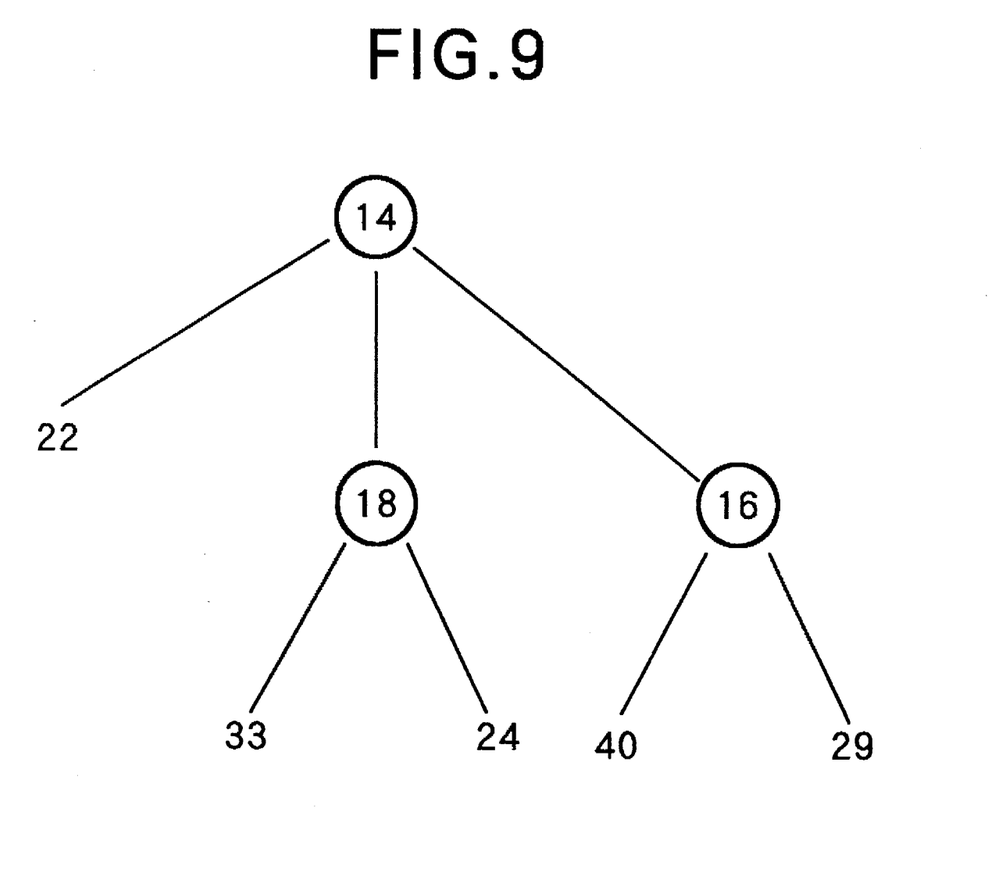
FIG. 9 is an illustration showing a relationship of analyzing regions retrieved by the present invention.

FIG. 9 shows one example of the result of division performed by the present invention. In the example of FIG. 9, there is illustrated the result of retrieval of the adjacent triangular element enclosing the new nodal point starting from the triangular element 14 with respect to the triangular element group shown in FIG. 7. FIG. 9 shows that as the result of retrieval, the triangular elements 14, 18 and 16 are retrieved as the triangular elements containing the new nodal point P within the regions defined by the circumscribed circles.

Figure 4:
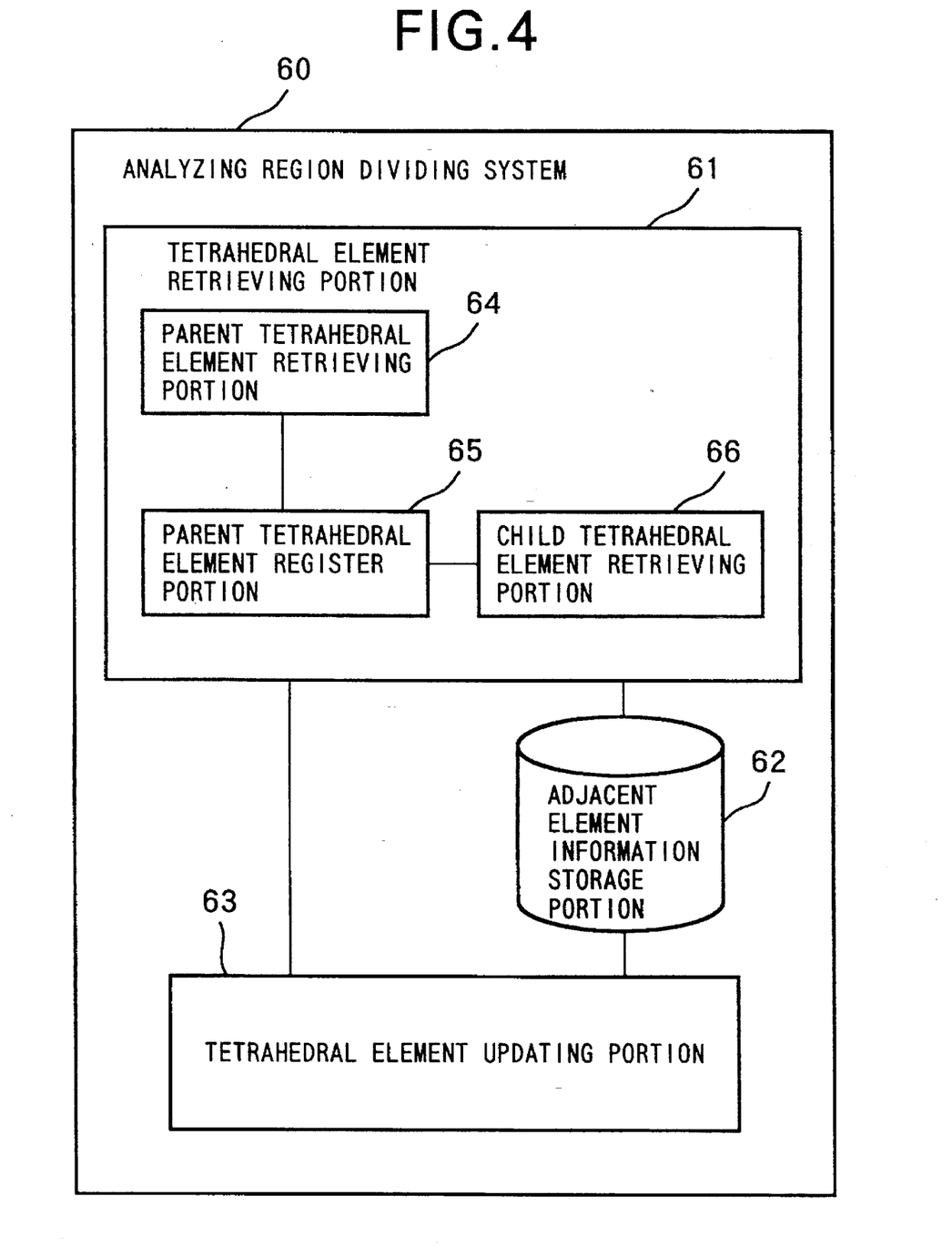
FIG. 4 is a block diagram showing a construction of the second embodiment of an analyzing region dividing system according to the present invention.

Next, the second embodiment of the analyzing region dividing system according to the present invention will be discussed.

As shown, the second embodiment of analyzing region dividing system 60 includes a tetrahedral element retrieving portion 61 for retrieving predetermined tetrahedral elements within an existing triangular element group as fractional regions dividing a semiconductor device, an adjacent element information storage portion for storing adjacent element information between tetrahedral elements, and a tetrahedral element updating portion 63 for further dividing the tetrahedral element group by way of Delaunay division with reference to the result of retrieval by the tetrahedral element retrieving portion 61.

The tetrahedral element retrieving portion 61 has a parent tetrahedral element retrieving portion 64 for retrieving a parent tetrahedral element to be a reference for Delaunay division, a parent tetrahedral element registering portion 65 for registering the retrieved tetrahedral element, and a child tetrahedral element retrieving portion 66 for retrieving a child tetrahedral element adjacent the parent tetrahedral element. The functions and operations of respective portions will be discussed later.

The adjacent element information storage portion 62 stores information associating adjacent tetrahedral elements with respect to the tetrahedral elements established by initial Delaunay division and newly established tetrahedral elements established by the tetrahedral element updating portion 63.

The tetrahedral element updating portion 63 makes reference to the result of retrieval of the tetrahedral element retrieving portion and updates the tetrahedral element group into a further divided new tetrahedral element group. Also, the tetrahedral element updating portion stores the adjacent element information of mutually adjacent tetrahedral elements in the newly established tetrahedral element group in the adjacent element information storage portion 62.

Figure 5:
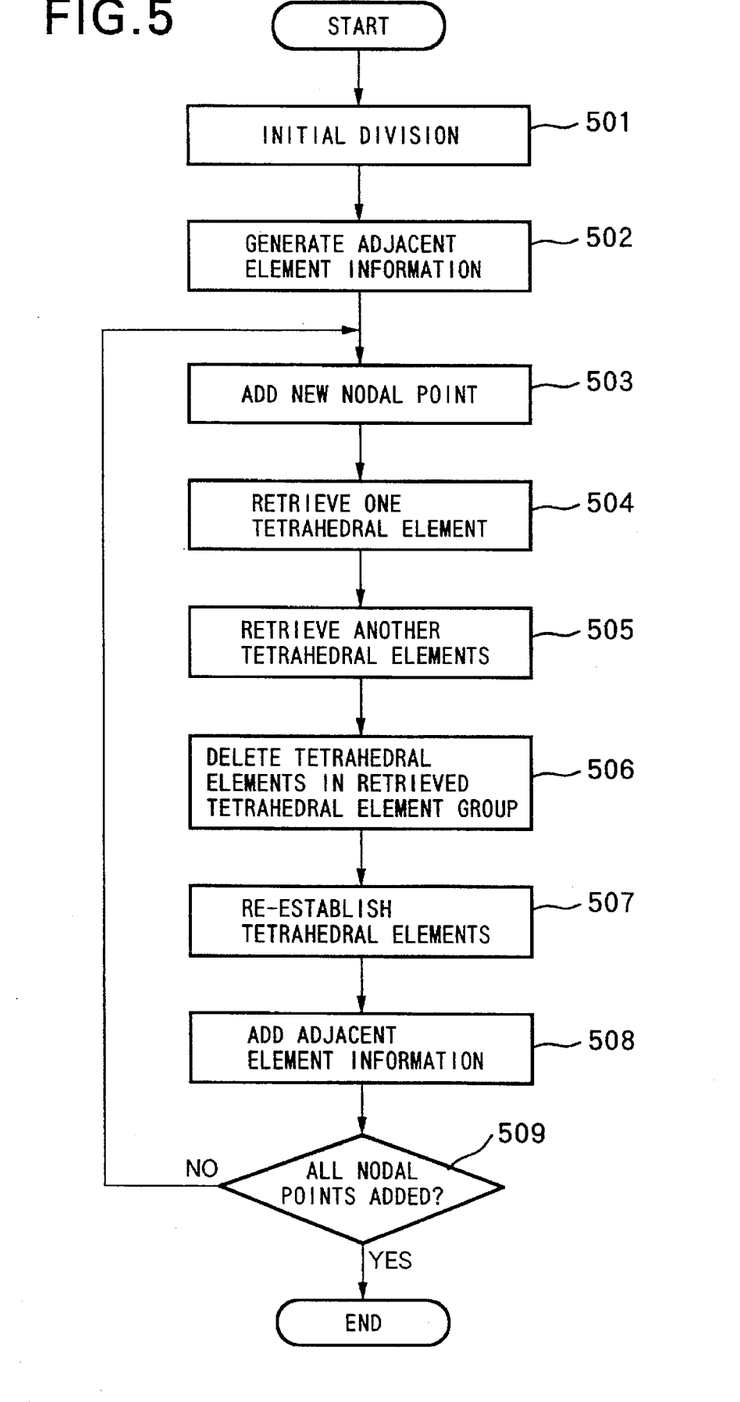
FIG. 5 is a flowchart showing operation of the second embodiment of an analyzing region dividing system.

Next, the operation of the shown embodiment will be discussed with reference to the flowchart of FIG. 5.

For dividing the semiconductor device as an object for analysis into small fractional regions, an initial Delaunay division is formed by way of an external command input or so forth (step 501). For instance, assuming that an analyzing region has a rectangular parallelpiped configuration, initial Delaunay division can be performed to divide the analyzing region into five tetrahedral elements. Then, for the tetrahedral element established by the initial Delaunay division, adjacent element information is provided (step 502). The adjacent element information is stored in the adjacent element information storage portion 62.

Next, a necessary new nodal point is added to a predetermined position within the analyzing region (step 503). Necessity of addition of the new nodal point is primarily caused:

(1) when nodal points are added for clearly defining the boundary of the material;

(2) when the nodal point is added for solving a crossing between the tetrahedral and the boundary of material included in the analyzing region for the purpose of improvement of precision of analysis;

(3) when the nodal point is added for deleting a tetrahedral having a circumcenter located out of the boundary of the material for the purpose of improvement of precision of analysis; and (4) when the circumcenter of the tetrahedral is set a as new nodal point for further dividing a tetrahedral having large circumscribed sphere into tetrahedrals having smaller circumscribed spheres for the purpose of improvement of precision of analysis.

The position to add the nodal point is the same as that discussed in the first embodiment.

Next, by the tetrahedral element retrieving portion 61, only one tetrahedral element having the circumscribed sphere enclosing the newly added nodal point is retrieved (step 504).

Next, the tetrahedral element retrieving portion 61 performs retrieval for retrieving a tetrahedral element adjacent to the retrieved tetrahedral element and having the circumscribed sphere including a new tangent point on the basis of the adjacent element information stored in the adjacent element storage portion 62 (step 505).

Next, by the tetrahedral element updating portion 63, all tetrahedral elements retrieved up to the step 505 are deleted (step 506). Then, by taking outermost planes of respective tetrahedral elements in the deleted tetrahedral element group as a base and the new nodal point as a peak, new tetrahedral elements are established (step 507). Thereafter, the tetrahedral element updating portion 63 adds the adjacent element information for the newly established tetrahedral elements and stores this information in the adjacent element information storage portion 62 (step 508).

The operator judges whether all of the necessary nodal points are added with reference to the configuration and physical structure of the semiconductor device and the current dividing condition by the analyzing region dividing system. If necessary, the foregoing operation is repeated by adding a new nodal point (step 509).

Figure 6:
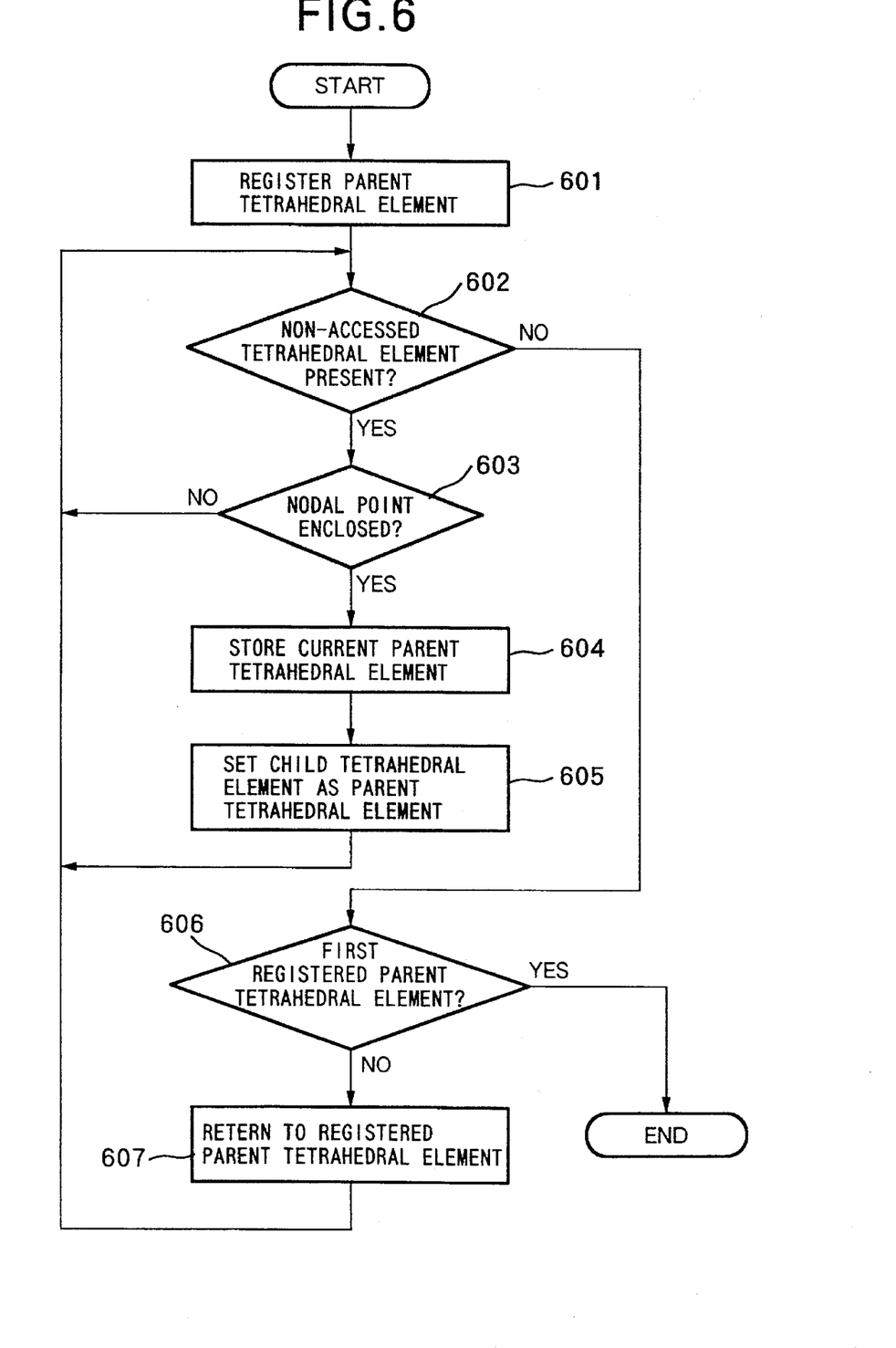
FIG. 6 is a flowchart showing a tetrahedral element retrieving method employed in the shown embodiment.

Next, discussion will be given for the retrieval operation for the tetrahedral element by the tetrahedral element retrieving portion 61 at the steps 504 and 505, with reference to the flowchart of FIG. 6.

At first, when the new nodal point is set for further dividing the semiconductor device into smaller fractional regions, one of the tetrahedral elements having the circumscribed sphere encloses the new nodal point as the parent tetrahedral element by the parent tetrahedral element retrieving portion 64 and the parent tetrahedral element registering portion 65 (step 601). The tetrahedral element to be the parent tetrahedral element is selected arbitrarily among the tetrahedral elements having the circumscribed circles enclosing the new nodal point. Then, judgement is made whether the child tetrahedral element retrieving portion 66 accesses all of the tetrahedral elements (child tetrahedral element) adjacent the registered tetrahedral element (parent tetrahedral element) (step 602).

When there is a child tetrahedral element which has not been accessed, the child tetrahedral element retrieving portion 66 judges whether the circumscribed sphere of the tetrahedral element in question encloses the nodal point, sequentially on a one-by one basis (step 603). Here, when the distance between the circumcenter of the tetrahedral element and the new nodal point is greater than the radius of the circumscribed sphere, judgement is made that the new nodal point is not enclosed in the circumscribed sphere of the tetrahedral element in question. In contrast, when the distance between the circumcenter of the tetrahedral element and the new nodal point is smaller than or equal to the radius of the circumscribed sphere, judgement is made that the new nodal point is enclosed in the circumscribed sphere of the tetrahedral element in question.

When judgement is made by the child tetrahedral element retrieving portion 66 that the child tetrahedral element in question encloses the new nodal point, the information of the parent tetrahedral element is stored (step 604). Then, by taking the child tetrahedral element processed as set forth above as the parent tetrahedral element, the foregoing process is repeated (step 605). On the other hand, when the child tetrahedral element retrieving portion 66 judges that the circumscribed sphere of the child tetrahedral element in question does not enclose the new nodal point, the foregoing process is performed with respect to the next child tetrahedral element (step 603).

After accessing all of the child tetrahedral elements adjacent the parent tetrahedral element registered in the parent tetrahedral element register portion 64, the parent tetrahedral element register portion 65 checks whether the current parent tetrahedral element is the first parent tetrahedral element registered (step 606). Then, if judgement is made that the parent tetrahedral element in question is not the first registered one, the process is repeated by returning to the registered parent tetrahedral element (step 607). On the other hand, when the judgement that the parent tetrahedral element in question is the first one registered, it means that all of the tetrahedral elements having a circumscribed sphere enclosing the new nodal point are retrieved around the first registered tetrahedral element as the parent tetrahedral element. Therefore, the process is terminated (step 606). Here, the tetrahedral elements registered as the parent tetrahedral elements are all tetrahedral elements having the circumscribed spheres enclosing the new nodal point.

As set forth above, in the present invention, since the information concerning an adjacent triangular element or an adjacent tetrahedral element is stored with respect to all of the triangular elements or the tetrahedral elements, and a check is performed whether the circumscribed circle or the circumscribed sphere enclose new nodal point, starting from an arbitrary selected one of the triangular elements or the tetrahedral elements and sequentially in order with respect to following adjacent triangular elements or the tetrahedral elements, retrieval of the triangular element or the tetrahedral element having the circumscribed circle or the circumscribed sphere enclosing the new nodal point is accomplished at high speed. In the conventional method, for establishing n in number of the triangular element or the tetrahedral element, (n−1) times of retrieval process is required with respect to each triangular element or tetrahedral element. Therefore, the total number of retrieval processes becomes the square of n. In contrast to this, according to the present invention, for establishing n in number of triangular elements or tetrahedral elements, only a finite number c of retrievals is required. Therefore, the total number of retrievals becomes one power of n. In practice, since the n in two-dimensional division and in three-dimensional division becomes respectively about 10,000 and 120,000, the present invention is particularly effective for three-dimensional division.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as being limited to the specific embodiments set out above but to include all possible embodiments which can be embodied within the scope encompassed and equivalents thereof with respect to the features set out in the appended claims.

What is claimed is:

1. A method for dividing a region to be analyzed in a semiconductor device comprising the steps of:

performing an initial division with respect to the region to be analyzed in the semiconductor device for initially dividing said region to be analyzed into a plurality of fractional elements of a predetermined configuration;

generating adjacent element information for the plurality of fractional elements established by the initial division performing step;

adding a new nodal point to a predetermined region to be analyzed in the semiconductor device;

retrieving one fractional element having a circumscribed region enclosing said new nodal point as a specific fractional element;

retrieving surrounding other fractional elements adjacent said specific fractional element and having a circumscribed region enclosing said new nodal point for establishing a fractional element group of retrieved fractional elements;

re-establishing said fractional elements as newly established fractional elements in a region defined by a boundary of said fractional element group on the basis of said boundary of said fractional element group and said new nodal point as a peak of respective fractional elements; and adding adjacent element information for respective ones of said newly established fractional elements;

the step of retrieving surrounding other fractional elements comprising the steps of making a judgment outwardly on a one-by-one basis whether a circumscribed region of the surrounding other fractional elements adjacent the specific fractional element encloses the new nodal point and repeating the judgment until the judgment is completed for all the surrounding other fractional elements having a circumscribed region enclosing the new nodal point.

2. A method as set forth in claim 1, wherein said fractional element is of triangular configuration and said circumscribed region is defined by a circumscribed circle of said triangular fractional element.

3. A method as set forth in claim 2, wherein said step of retrieving other fractional elements comprising the steps of:

registering said one triangular element as a parent triangular element;

making judgement whether a child triangular element having the circumscribed circle enclosing said new nodal point is present among child triangular elements adjacent said parent triangular element;

storing said parent triangular element as an objective triangular element for retrieval and setting the child triangular element having the circumscribed circle enclosing said new nodal point as new parent triangular element when said child triangular element having the circumscribed circle enclosing said new nodal point is present; and making judgement whether said process is performed with respect to all of the triangular elements having circumscribed circles enclosing said new nodal point and repeating said process until said process is completed for all of the triangular elements having circumscribed circles enclosing said new nodal point.

4. A method as set forth in claim 1, wherein said fractional element is of a tetrahedral configuration and said circumscribed region is defined by a circumscribed sphere of said tetrahedral fractional element.

5. A method as set forth in claim 4, wherein said step of retrieving other fractional elements comprising the steps of:

registering said one tetrahedral element as a parent tetrahedral element;

making judgement whether a child tetrahedral element having the circumscribed sphere enclosing said new nodal point is present among child tetrahedral elements adjacent said parent tetrahedral element;

storing said parent tetrahedral element as an objective tetrahedral element for retrieval and setting the child tetrahedral element having the circumscribed sphere enclosing said new nodal point as new parent tetrahedral element when said child tetrahedral element having the circumscribed sphere enclosing said new nodal point is present; and making judgement whether said process is performed with respect to all of the tetrahedral elements having circumscribed spheres enclosing said new nodal point and repeating said process until said process is completed for all of the tetrahedral elements having circumscribed spheres enclosing said new nodal point.

6. A system for dividing a region to be analyzed in a semiconductor device comprising:

means for performing an initial division with respect to the region to be analyzed in the semiconductor device for initially dividing said region to be analyzed into a plurality of fractional elements of a predetermined configuration;

means for generating adjacent element information for the plurality of fractional elements established by the initial division performing means;

means for adding a new nodal point to a predetermined region to be analyzed in the semiconductor device;

means for retrieving one fractional element having a circumscribed region enclosing said new nodal point as a specific fractional element;

means for retrieving surrounding other fractional elements adjacent said specific fractional element and having a circumscribed region enclosing said new nodal point for establishing a fractional element group of retrieved fractional elements;

means for re-establishing said fractional elements as newly established fractional elements in the region defined by a boundary of said fractional element group on the basis of said boundary of said fractional element group and said new nodal point as a peak of respective fractional elements; and means for adding adjacent element information for respective ones of said newly established fractional elements;

the means for retrieving surrounding other fractional elements comprising means for making a judgment outwardly on a one-by-one basis whether a circumscribed region of the surrounding other fractional elements adjacent the specific fractional element encloses the new nodal point and means for repeating the judgment until the judgment is completed for all the surrounding other fractional elements having a circumscribed region enclosing the new nodal point.

7. A system as set forth in claim 6, wherein said fractional element is of triangular configuration and said circumscribed region is defined by a circumscribed circle of said triangular fractional element.

8. A system as set forth in claim 7, wherein said step of retrieving other fractional elements comprising:

means for registering said one triangular element as a parent triangular element;

means for making judgement whether a child triangular element having the circumscribed circle enclosing said new nodal point is present among child triangular elements adjacent said parent triangular element;

means for storing said parent triangular element as an objective triangular element for retrieval and setting the child triangular element having the circumscribed circle enclosing said new nodal point as new parent triangular element when said child triangular element having the circumscribed circle enclosing said new nodal point is present; and means for making judgement whether said process is performed with respect to all of the triangular elements having circumscribed circles enclosing said new nodal point and repeating said process until said process is completed for all of the triangular elements having circumscribed circles enclosing said new nodal point.

9. A system as set forth in claim 6, wherein said fractional element is of a tetrahedral configuration and said circumscribed region is defined by a circumscribed sphere of said tetrahedral fractional element.

10. A system as set forth in claim 9, wherein said step of retrieving other fractional elements comprising:

means for registering said one tetrahedral element as a parent tetrahedral element;

means for making judgement whether a child tetrahedral element having the circumscribed sphere enclosing said new nodal point is present among child tetrahedral elements adjacent said parent tetrahedral element;

means for storing said parent tetrahedral element as an objective tetrahedral element for retrieval and setting the child tetrahedral element having the circumscribed sphere enclosing said new nodal point as new parent tetrahedral element when said child tetrahedral element having the circumscribed sphere enclosing said new nodal point is present; and means for making judgement whether said process is performed with respect to all of the tetrahedral elements having circumscribed spheres enclosing said new nodal point and repeating said process until said process is completed for all of the tetrahedral elements having circumscribed spheres enclosing said new nodal point.

* * * * *